US012772557B2

(12) United States Patent
Chu et al.

(10) Patent No.: US 12,772,557 B2
(45) Date of Patent: Oct. 20, 2026

(54) CIRCUIT LAYOUTS WITH VARIABLE CIRCUIT CELL HEIGHTS IN THE SAME CIRCUIT ROW

(71) Applicant: International Business Machines Corporation, Armonk, NY (US)

(72) Inventors: Albert M. Chu, Nashua, NH (US); Brent A. Anderson, Jericho, VT (US); Nicholas Anthony Lanzillo, Wynantskill, NY (US); Reinaldo Vega, Mahopac, NY (US); Lawrence A. Clevenger, Saratoga Springs, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 18/079,079

(22) Filed: Dec. 12, 2022

(65) Prior Publication Data

US 2024/0194681 A1 Jun. 13, 2024

(51) Int. Cl.
*H10D 84/90* (2025.01)

(52) U.S. Cl.
CPC ......... *H10D 84/907* (2025.01); *H10D 84/922* (2025.01); *H10D 84/981* (2025.01)

(58) Field of Classification Search
None
See application file for complete search history.

(56) References Cited

U.S. PATENT DOCUMENTS

| | | | |
|---|---|---|---|
| 5,798,541 A | 8/1998 | Jassowski | |
| 6,336,207 B2 | 1/2002 | Shinomiya et al. | |
| 6,385,761 B1 | 5/2002 | Breid | |
| 7,129,562 B1 | 10/2006 | Gheewala et al. | |
| 8,698,205 B2 | 4/2014 | Tzeng et al. | |
| 10,713,410 B2 | 7/2020 | Wang et al. | |
| 11,011,545 B2 | 5/2021 | Guo et al. | |
| 11,075,195 B2 | 7/2021 | Wang et al. | |
| 11,170,152 B2 | 11/2021 | Chen et al. | |
| 11,263,378 B2 | 3/2022 | Ou et al. | |
| 11,410,988 B2 | 8/2022 | Lee et al. | |
| 2020/0402968 A1* | 12/2020 | Zhuang | H10D 89/10 |

FOREIGN PATENT DOCUMENTS

| | | |
|---|---|---|
| JP | H06140505 A | 5/1994 |
| JP | 2000022084 A * | 1/2000 |

* cited by examiner

*Primary Examiner* — Hung K Vu
(74) *Attorney, Agent, or Firm* — Kimberly Zillig; Ryan, Mason & Lewis, LLP

(57) ABSTRACT

A semiconductor structure comprising a first circuit row and a second circuit row adjacent the first circuit row. The first circuit row comprises a first circuit cell and a second circuit cell, the first circuit cell having a first cell height greater than a first row height of the first circuit row, the second circuit cell having a second cell height different than the first cell height. The second circuit row comprises a third circuit cell, the third circuit cell having a third cell height less than a second row height of the second circuit row. The first circuit cell in the first circuit row is at least partially aligned with the third circuit cell in the second circuit row.

20 Claims, 7 Drawing Sheets

CIRCUIT LAYOUTS WITH VARIABLE CIRCUIT CELL HEIGHTS IN THE SAME CIRCUIT ROW

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming circuit layouts with circuit cells having variable cell heights placed in the same circuit row.

In one embodiment, a semiconductor structure comprises a first circuit row and a second circuit row adjacent the first circuit row. The first circuit row comprises a first circuit cell and a second circuit cell, the first circuit cell having a first cell height greater than a first row height of the first circuit row, the second circuit cell having a second cell height different than the first cell height. The second circuit row comprises a third circuit cell, the third circuit cell having a third cell height less than a second row height of the second circuit row. The first circuit cell in the first circuit row is at least partially aligned with the third circuit cell in the second circuit row.

In another embodiment, a semiconductor structure comprises a first circuit row and a second circuit row adjacent the first circuit row. The first circuit row comprises a first circuit cell having a first cell height greater than a first row height of the first circuit row. The second circuit row comprises a second circuit cell having a second cell height greater than a second row height of the second circuit row. A first portion of the first circuit cell extends into the second circuit row, a second portion of the second circuit cell extends into the first circuit row, and the first portion of the first circuit cell is offset from the second portion of the second circuit cell.

In another embodiment, a semiconductor structure comprises a first circuit row and a second circuit row adjacent the first circuit row. The first circuit row has a first set of two or more circuit cells having different cell heights, wherein horizontal centers of the first set of two or more circuit cells are aligned with a first horizontal center line of the first circuit row. The second circuit row has a second set of two or more circuit cells having different cell heights, wherein horizontal centers of the second set of two or more circuit cells are aligned with a second horizontal center line of the second circuit row.

These and other features and advantages of embodiments described herein will become more apparent from the accompanying drawings and the following detailed description.

DETAILED DESCRIPTION

Figure 1A:
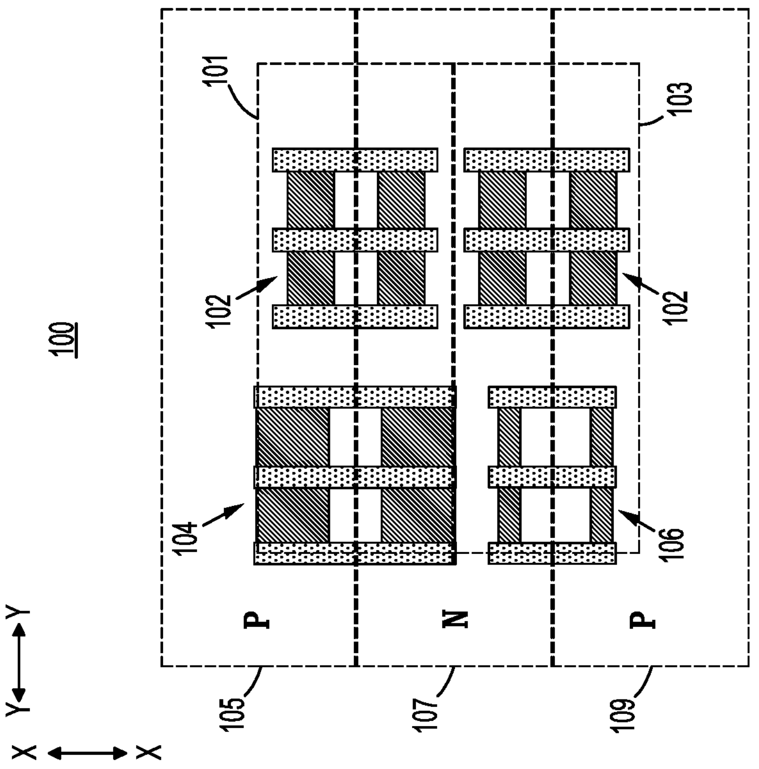
FIGS. 1A and 1B show views of structures with and without circuit cells having variable cell heights within circuit rows, according to an embodiment of the invention.

Illustrative embodiments of the invention may be described herein in the context of illustrative methods for forming circuit layouts with circuit rows having circuit cells with varying cell heights, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

With continuous scaling, more and more devices (e.g., transistors) are packed into integrated circuit chips (e.g., into one or more 100 millimeter $(mm)_2$ chips). To provide desired functionality, the devices must be interconnected through wiring and routing. With an increased number of devices in an integrated circuit, more and more wiring and routing resources are required to precisely connect the integrated circuit as desired for a particular use case. Thus, for example, more and more metal layers may be needed to connect all of the devices in an integrated circuit.

A circuit layout may include one or more circuit rows, with each circuit row including one or more circuit cells. The circuit cells may be selected from a library of circuit cells. In a conventional approach, each circuit row would include only circuit cells with a nominal cell height corresponding to the row height of the circuit row. In some cases, different circuit rows may have different row heights. Even in such an arrangement, however, all circuit cells within a given circuit row would have the same cell height. A circuit layout may alternatively include adjusting cell widths to extend outward within a circuit row, but such a layout does not enable adjacent circuit rows to have circuit cells with varying cell heights, and further does not allow for alignment of signal tracks of different circuit cells within a circuit row. Illustrative embodiments provide circuit layouts which allow for intermixing of circuit cells with different cell heights in a same circuit row.

Circuit layouts in some embodiments include circuit cells with N different cell heights placed in a same circuit row, where N≥2. The circuit cells are placed such that there are no circuit cell overlaps between adjacent circuit rows. A device within a circuit cell in a first circuit row can extend into a second, adjacent circuit row if it does not create an overlap with any of the circuit cells in the second circuit row. A circuit layout may include circuit cells having varying cell heights, such as circuit cells with a nominal height (e.g., matching a row height of the circuit rows in the circuit layout), a reduced height (e.g., smaller than the row height of the circuit rows in the circuit layout), and expanded height (e.g., taller than the row height of the circuit rows in the circuit layout, where circuit cells with the expanded height extend into adjacent circuit rows).

Devices in a same circuit row may overlap in a vertical direction, such as where a lower device edge of a first circuit cell extends past an upper device edge of a second circuit cell within the same circuit row. Devices in adjacent circuit cells may have multiple heights, where devices with the tallest heights in a circuit cell may overlap with devices in adjacent circuit cells (e.g., in the same or different circuit rows). In some embodiments, gates of devices in circuit cells with the expanded height extend past the nominal cell height boundary. This extension may be past the top and bottom of the nominal cell height boundary. A circuit row may have a fixed "horizontal" center line, where circuit cell center lines are placed in alignment with the fixed horizontal center line of the circuit row, and the circuit row includes circuit cells with different cell heights. The circuit layouts may include circuit cell designs with inset power rails, with backside power rails, or combinations thereof. Further, circuit cell designs can span multiple circuit rows each including circuit cells with variable cell heights.

Figure 1B:
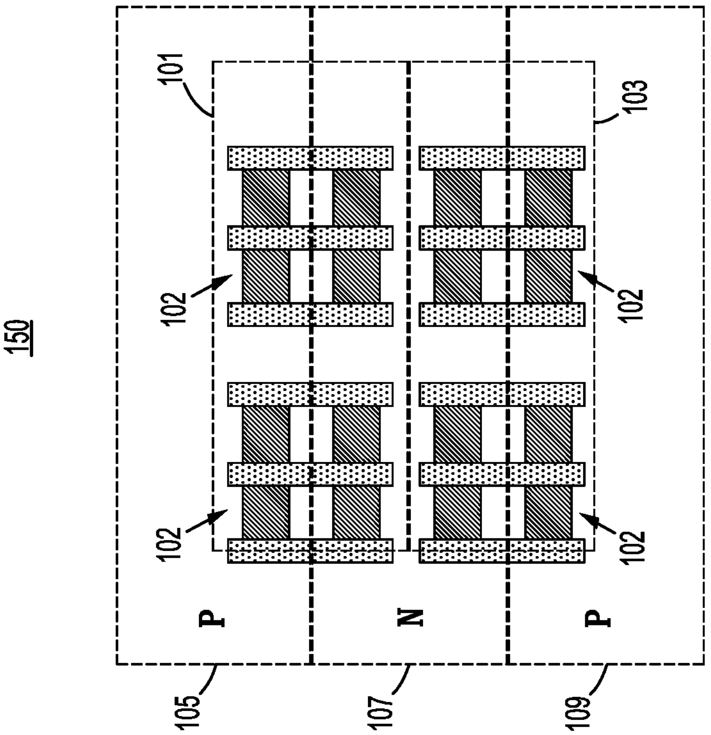

FIGS. 1A and 1B show respective plan views 100 and 150 of circuit layouts which do and do not include circuit cells with varying cell heights within the same circuit row. FIG. 1A shows a circuit layout which includes two circuit rows 101 and 103, with the first circuit row 101 including a circuit cell 102 with a nominal cell height and a circuit cell 104 with an expanded cell height (e.g., greater than the nominal cell height), and the second circuit row 103 including a circuit cell 102 with the nominal cell height and a circuit cell 106 with a reduced cell height (e.g., less than the nominal cell height). Here, the circuit cells 104 and 106 are aligned with one another (in direction Y) in the adjacent first circuit row 101 and second circuit row 103, such that there is no overlap (in direction X) between the devices in the circuit cells 104 and 106. FIG. 1A further shows a region 105 where p-type field-effect transistor (PFET) devices within the circuit cells 102, 104 and 106 are formed, a region 107 where n-type field-effect transistor (NFET) devices within the circuit cells 102, 104 and 106 are formed, and a region 109 where other PFET devices within the circuit cells 102, 104 and 106 are formed. FIG. 1B shows a circuit layout where the first circuit row 101 and the second circuit row 103 each includes two circuit cells 102 with the nominal cell height.

Figure 2:
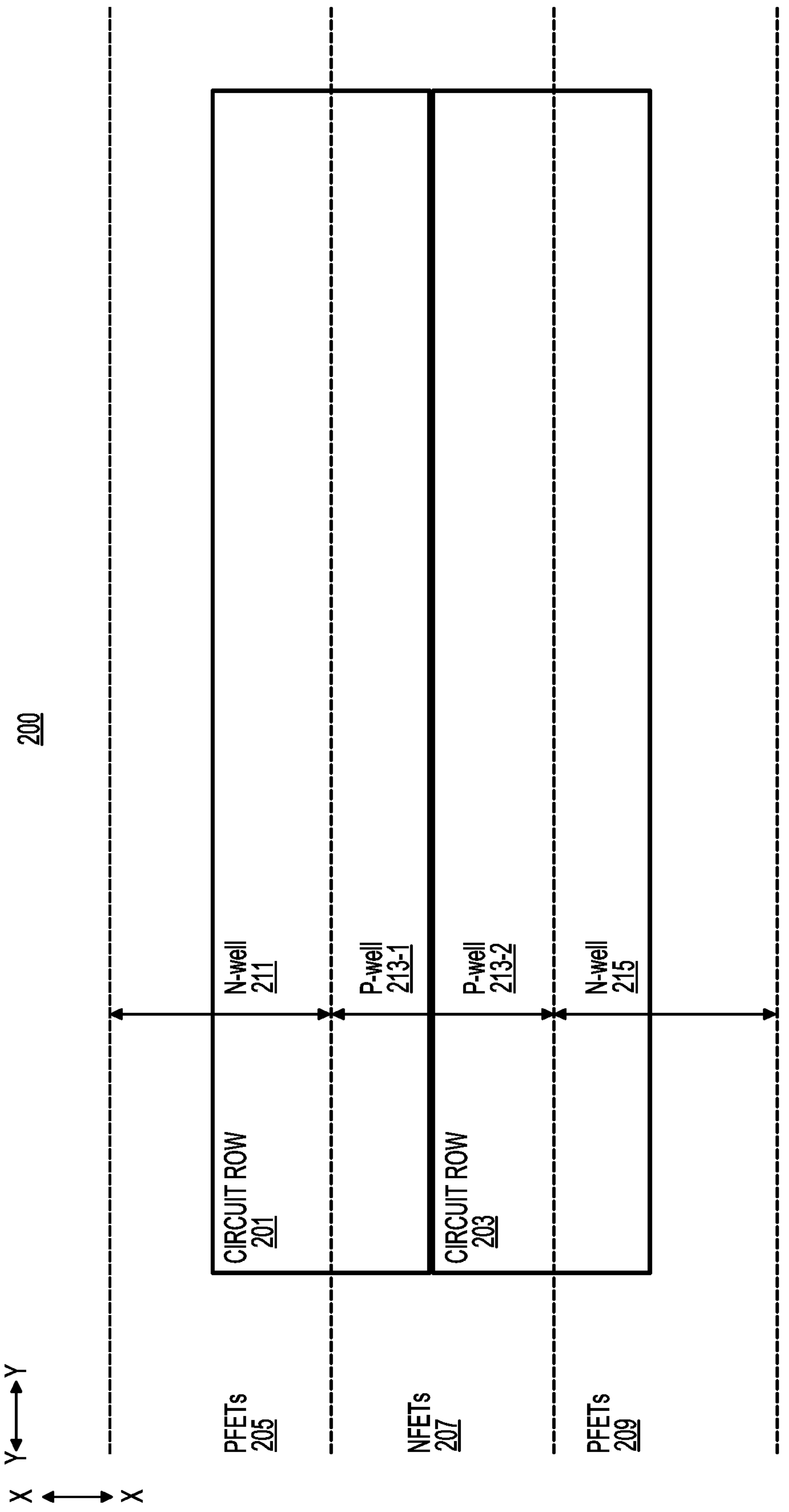
FIG. 2 shows a layout of circuit rows, according to an embodiment of the invention.

FIG. 2 shows a plan view 200, illustrating a circuit layout configuration. The circuit layout of FIG. 2 includes two circuit rows 201 and 203. Each of the first circuit row 201 and the second circuit row 203 includes regions where PFET and NFET devices will be formed. The first circuit row 201, for example, includes PFET devices 205 formed in an N-well region 211, as well as NFET devices 207 formed in a P-well region 213-1. The second circuit row 203 includes NFET devices 207 formed in a P-well region 213-2 and PFET devices 209 formed in an N-well region 215. As illustrated in FIG. 2, the P-well regions 213-1 and 213-2 are continuous (in direction X) across the adjacent circuit rows 201 and 203. Each of the circuit rows 201 and 203 has a row height (in direction X), which may be measured in terms of a number of tracks. Here, it is assumed that each of the circuit rows 201 and 203 has a same row height comprising a number of tracks corresponding to a nominal cell height of circuit cells that may be formed in the circuit rows 201 and 203.

Figure 3:
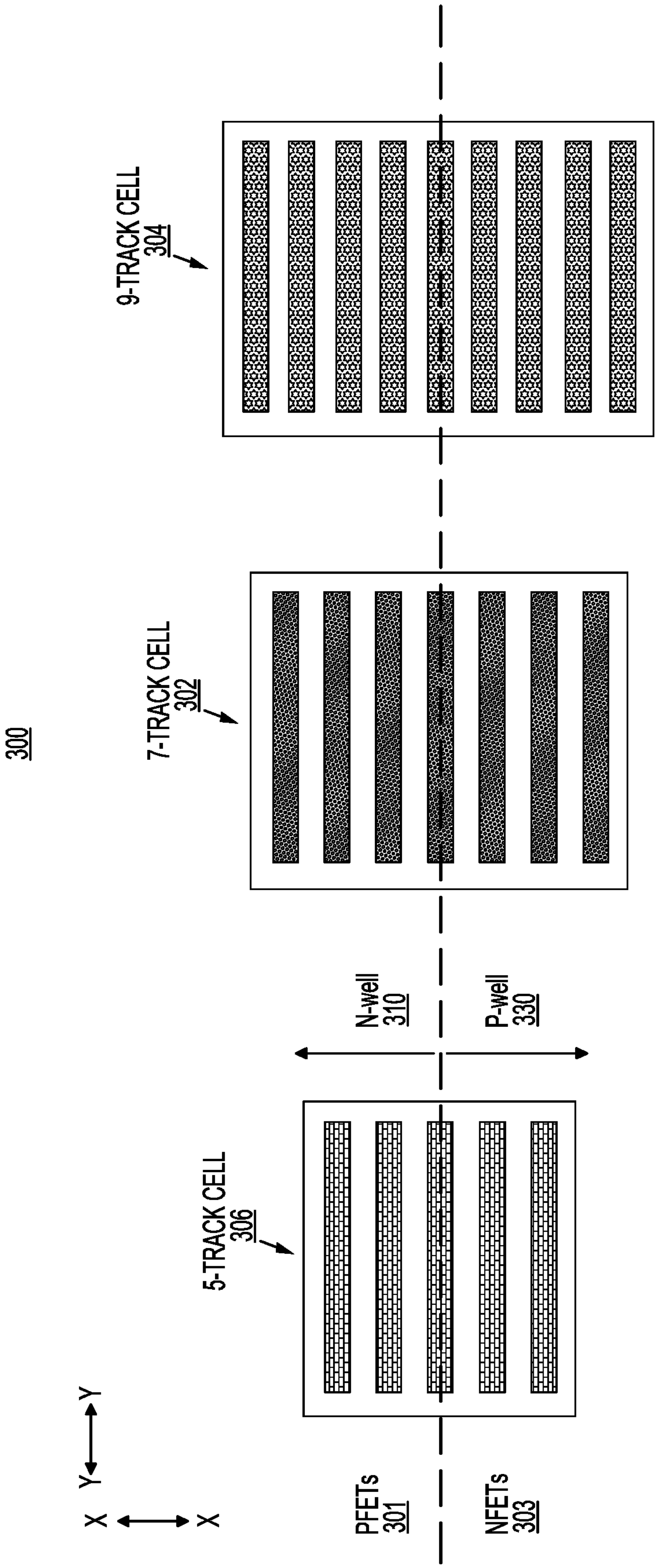
FIG. 3 shows a set of circuit cells with different cell heights, according to an embodiment of the invention.

FIG. 3 shows a view 300 of a library of standard circuit cells, including a 7-track cell 302, a 9-track cell 304, and a 5-track cell 306. The 7-track cell 302 is assumed to be the nominal cell height, with the 9-track cell 304 having an expanded cell height relative to the nominal cell height of the 7-track cell 302, and with the 5-track cell 306 having a reduced cell height relative to the nominal cell height of the 7-track cell 302. As discussed above, each of the circuit cells 302, 304 and 306 has PFET devices 301 formed in an N-well region 310 and NFET devices 303 formed in a P-well region 330. The boundary of the N-well region 310 and the P-well region 330 are at the center (in direction X) of each of the standard circuit cells 302, 304 and 306. In some embodiments, a backside power distribution network is used with direct contacts, such that a shared power rail at the "north" and "south" cell boundaries are not needed.

Figure 4B:
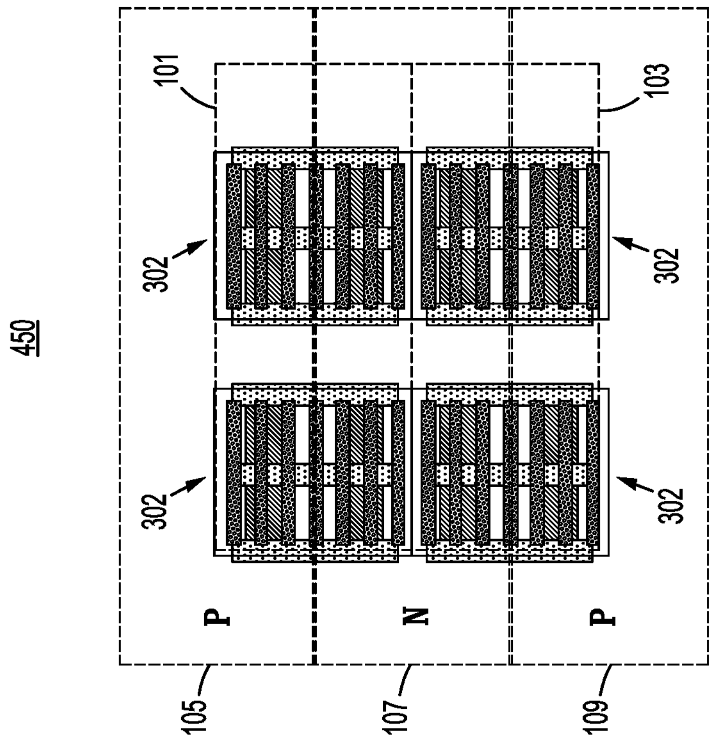
FIGS. 4A and 4B show views of structures with and without circuit cells having variable cell heights within circuit rows, according to an embodiment of the invention.
Figure 4A:
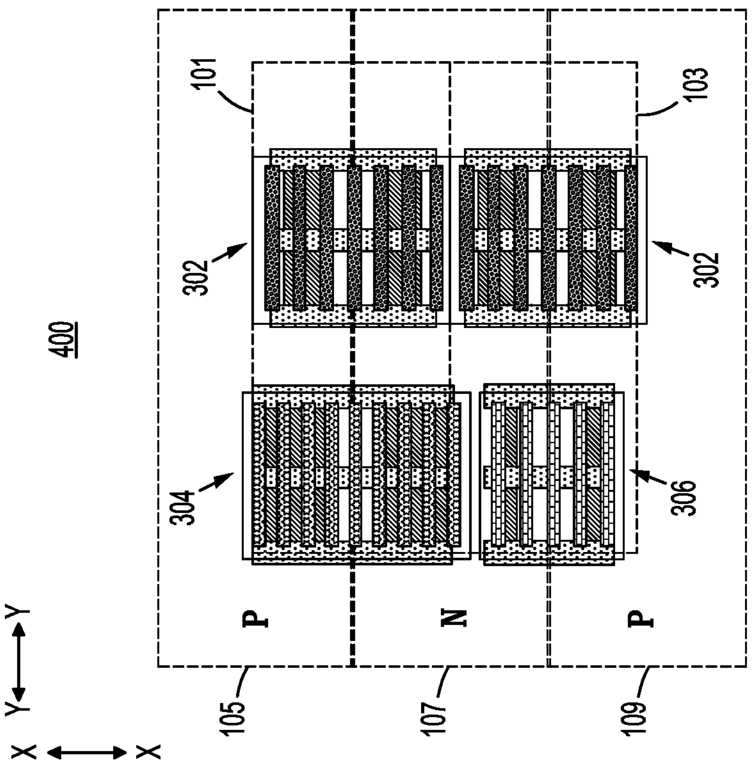

FIGS. 4A and 4B show respective plan views 400 and 450 of the circuit layouts shown in FIGS. 1A and 1B, respectively, with the standard circuit cells 302, 304 and 306 overlayed on the circuit cells 102, 104 and 106, respectively. For example, as shown in FIG. 4A, the 9-track cell 304 in first circuit row 101 is adjacent (in direction X) and aligned with (in direction Y) the 5-track cell 306 in second circuit row 103, and two 7-track cells 302 are adjacent (in direction X) and aligned (in direction Y) with one another in the circuit rows 101 and 103.

Figure 5:
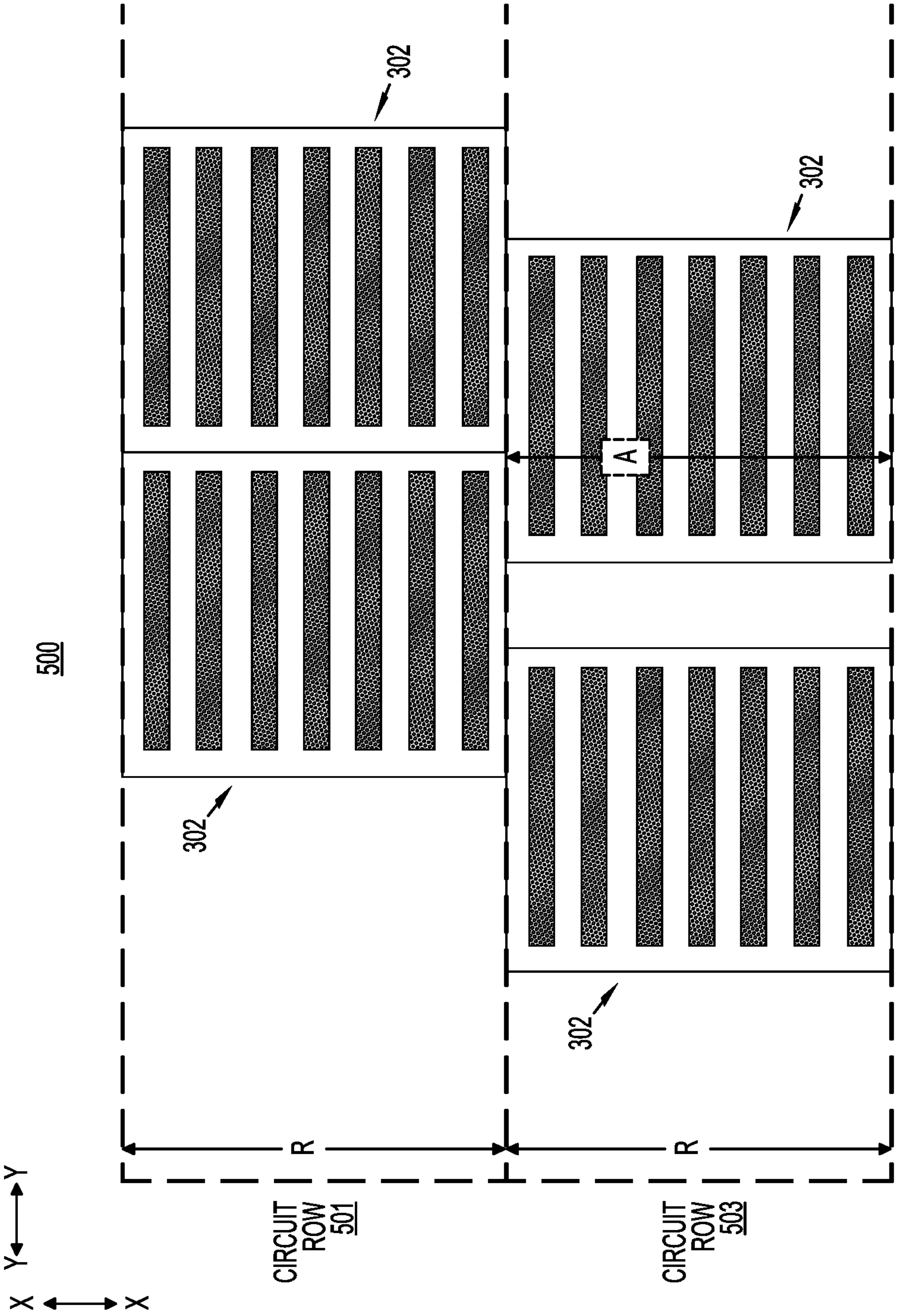
FIG. 5 shows a view of circuit rows with circuit cells having fixed cell heights, according to an embodiment of the invention.

FIG. 5 shows a plan view 500 of a circuit layout including circuit rows 501 and 503. Each of the circuit rows 501 and 503 has a circuit row height R (in direction X), which corresponds to the nominal cell height A of the 7-track cell 302. In a conventional approach, only circuit cells with the cell height A may be placed in the circuit rows 501 and 503 with row height R. Using the techniques described herein, however, circuit cells with different cell heights (e.g., cell heights greater than A) may be placed next to one another (in direction Y) in a circuit row, so long as in an adjacent (in direction X) circuit row there is either no circuit cell, or a circuit cell with a reduced cell height (e.g., a cell height less than A). Such arrangements are illustrated in the circuit layouts shown in FIGS. 1A, 4A and 6.

Figure 6:
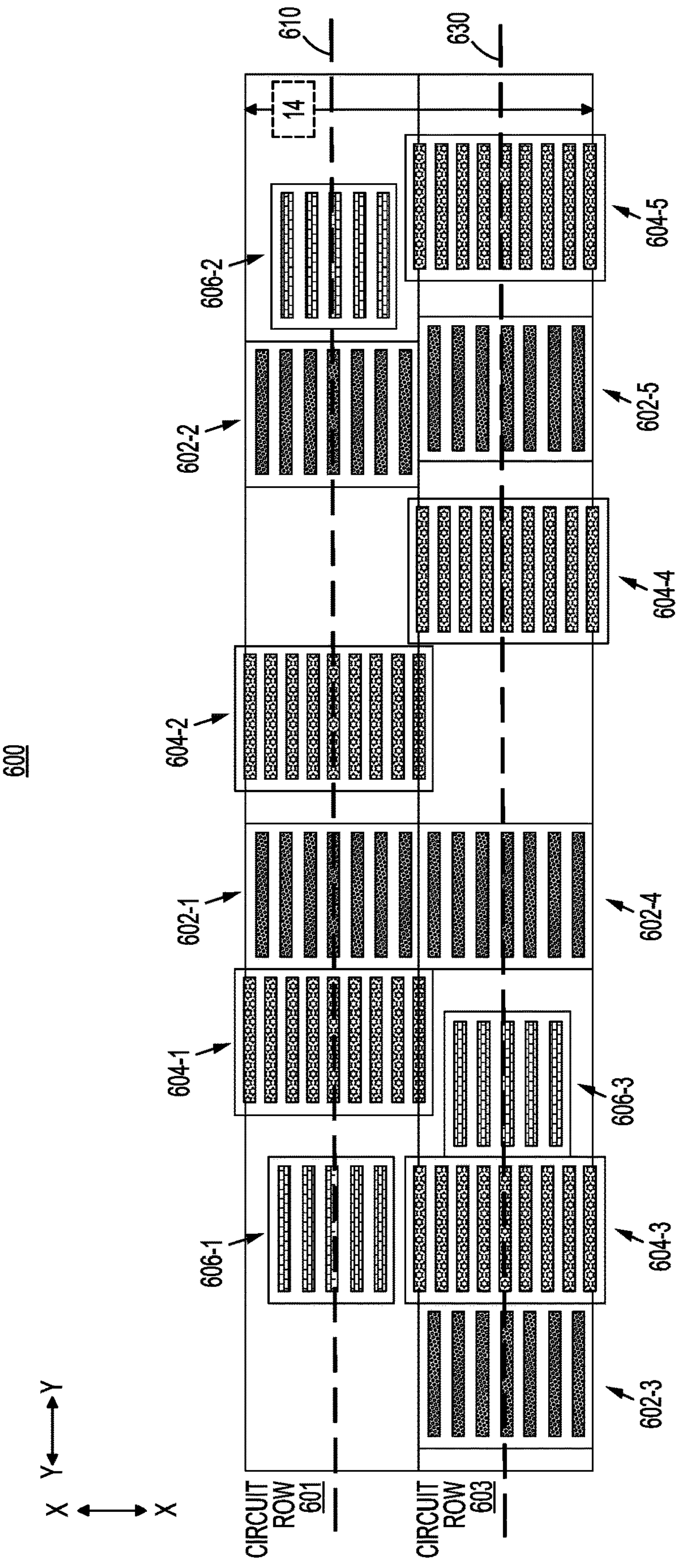
FIG. 6 shows a view of circuit rows with circuit cells having variable cell heights within each circuit row, according to an embodiment of the invention.

FIG. 6 shows a plan view 600 of a circuit layout including adjacent (in direction X) circuit rows 601 and 603 having corresponding center lines 610 and 630. Each of the circuit rows 601 and 603 is assumed to have the same row height of 7 tracks, such that the combination of the circuit rows 601 and 603 has an overall height of 14 tracks. The first circuit row 601 includes, from left to right, circuit cells 606-1, 604-1, 602-1, 604-2, 602-2, and 606-2, whose X direction centers are aligned with the center line 610. The second circuit row 603 includes, from left to right, circuit cells 602-3, 604-3, 606-3, 602-4, 604-4, 602-5 and 604-5, whose X direction centers are aligned with the center line 630. The circuit cells 602-1, 602-2, 602-3 and 602-4 are instances of the circuit cell 302 having the nominal cell height, while the circuit cells 604-1, 604-2, 604-3, 604-4 and 604-5 are instances of the 9-track cell circuit cell 304 having the expanded cell height, and the circuit cells 606-1, 606-2 and 606-3 are instances of the 5-track cell circuit cell 306 having the reduced cell height.

The circuit cell 606-1 in circuit row 601 is adjacent (in direction X) and aligned (in direction Y) to the circuit cell 604-3 in the circuit row 603. The expanded cell height of circuit cell 604-3 in circuit row 603 is accommodated by being placed adjacent (in direction X) and fully aligned (in direction Y) with the circuit cell 606-1 having the reduced cell height in circuit row 601.

The circuit cell 604-1 in circuit row 601 is adjacent (in direction X) and partially aligned (in direction Y) to the circuit cell 606-3 in the circuit row 603. The expanded cell height of circuit cell 604-1 in circuit row 601 is accommodated by being placed adjacent (in direction X) to the circuit cell 606-3 in the circuit row 603, but where there is an offset (in direction Y) between the circuit cells 604-1 and 606-3.

The circuit cells 602-1 and 602-4 are adjacent (in direction X) and aligned (in direction Y) with one another in the circuit rows 601 and 603, which is permitted as both the circuit cells 602-1 and 602-4 have the nominal cell height.

The circuit cells 604-2 and 604-4 are placed in the circuit rows 601 and 603 with an offset (in direction Y) that accommodates the expanded cell heights of the circuit cells 604-2 and 604-4.

The circuit cells 602-2 and 602-5 are placed in the circuit rows 601 and 603 adjacent (in direction X) and partially aligned (in direction Y) with one another, which is permitted as both the circuit cells 602-2 and 602-5 have the nominal cell height.

The circuit cell 606-2 in circuit row 601 is adjacent (in direction X) and partially aligned (in direction Y) to the circuit cell 604-5 in the circuit row 603. The expanded cell height of circuit cell 604-5 is accommodated by being placed adjacent (in direction X) to the circuit cell 606-2 in the circuit row 601, with an offset (in direction Y) between the circuit cells 606-2 and 604-5.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 7:
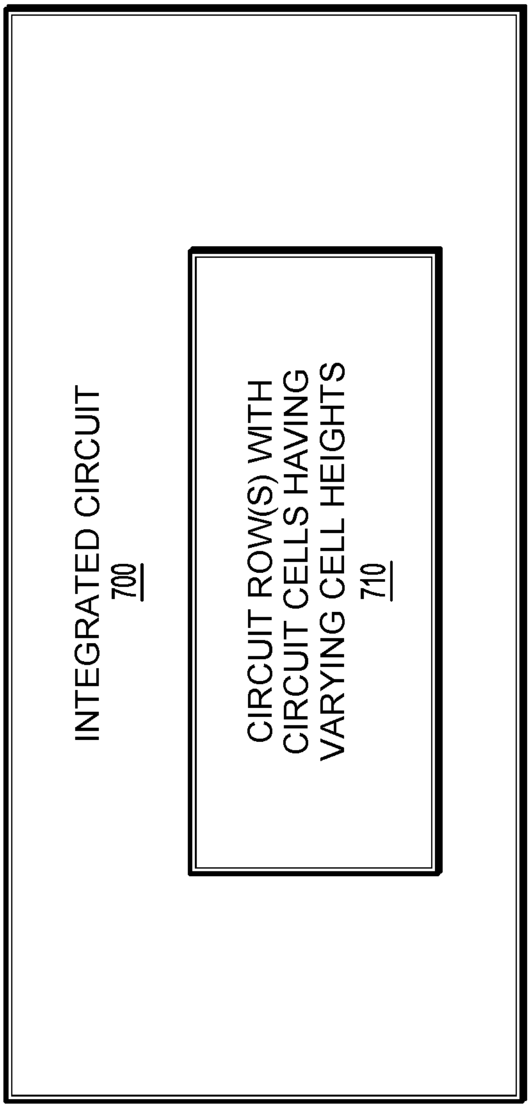
FIG. 7 depicts an integrated circuit comprising circuit rows with circuit cells having varying cell heights, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 7 shows an example integrated circuit 700 which includes one or more wafer circuit rows 710 having circuit cells with varying cell heights.

In some embodiments, a semiconductor structure comprising a first circuit row and a second circuit row adjacent the first circuit row. The first circuit row comprises a first circuit cell and a second circuit cell, the first circuit cell having a first cell height greater than a first row height of the first circuit row, the second circuit cell having a second cell height different than the first cell height. The second circuit row comprises a third circuit cell, the third circuit cell having a third cell height less than a second row height of the second circuit row. The first circuit cell in the first circuit row is at least partially aligned with the third circuit cell in the second circuit row.

Horizontal centers of the first circuit cell and the second circuit cell may be aligned with a horizontal center line of the first circuit row.

The second cell height may comprise a nominal cell height that is the same as the first row height of the first circuit row.

The second cell height may comprise a reduced cell height that is less than the first row height of the first circuit row. The first circuit row may further comprise a fourth circuit cell, the fourth circuit cell having a nominal cell height that is equal to the first row height of the first circuit row.

The second circuit row may further comprise a fourth circuit cell having a fourth cell height greater than the second row height of the second circuit row.

The first row height of the first circuit row may be equal to the second row height of the second circuit row.

The first circuit cell having the first cell height may be adjacent to the second circuit cell having the second cell height within the first circuit row.

At least one of the first circuit cell and the second circuit cell may have one or more inset power rails.

At least one of the first circuit cell and the second circuit cell may have one or more backside power rails.

In some embodiments, a semiconductor structure comprises a first circuit row and a second circuit row adjacent the first circuit row. The first circuit row comprises a first circuit cell having a first cell height greater than a first row height of the first circuit row. The second circuit row comprises a second circuit cell having a second cell height greater than a second row height of the second circuit row. A first portion of the first circuit cell extends into the second circuit row, a second portion of the second circuit cell extends into the first circuit row, and the first portion of the first circuit cell is offset from the second portion of the second circuit cell.

A horizontal center of the first circuit cell may be aligned with a first horizontal center line of the first circuit row and a horizontal center of the second circuit cell may be aligned with a second horizontal center line of the second circuit row.

The first circuit row may further comprise a third circuit cell having a third cell height less than the first row height of the first circuit row.

The first circuit row may further comprise a third circuit cell having a third cell height equal to the first row height of the first circuit row.

The first row height of the first circuit row may be equal to the second row height of the second circuit row.

In some embodiments, a semiconductor structure comprises a first circuit row and a second circuit row adjacent the first circuit row. The first circuit row has a first set of two or more circuit cells having different cell heights, wherein horizontal centers of the first set of two or more circuit cells are aligned with a first horizontal center line of the first circuit row. The second circuit row has a second set of two or more circuit cells having different cell heights, wherein horizontal centers of the second set of two or more circuit cells are aligned with a second horizontal center line of the second circuit row.

The first set of two or more circuit cells may comprise a first circuit cell having a first cell height greater than a first row height of the first circuit row, the second set of two or more circuit cells may comprise a second circuit cell having a second cell height less than a second row height of the second circuit row, and the first circuit cell in the first circuit row may be at least partially horizontally aligned with the second circuit cell in the second circuit row.

The first set of two or more circuit cells may comprise a first circuit cell having a first cell height greater than a first row height of the first circuit row, the second set of two or more circuit cells may comprise a second circuit cell having a second cell height greater than a second row height of the second circuit row, and the first circuit cell in the first circuit row may be horizontally offset from the second circuit cell in the second circuit row.

The first set of two or more circuit cells may comprises a first circuit cell having a first cell height greater than a first row height of the first circuit row and a second circuit cell having a second cell height less than the first row height of the first circuit row.

The first set of two or more circuit cells may comprise a first circuit cell having a first cell height greater than a first row height of the first circuit row and a second circuit cell having a second cell height equal to the first row height of the first circuit row.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:

a first circuit row, the first circuit row comprising a first circuit cell and a second circuit cell, the first circuit cell having a first cell height greater than a first row height of the first circuit row, the second circuit cell having a second cell height different than the first cell height; and a second circuit row adjacent the first circuit row, the second circuit row comprising a third circuit cell, the third circuit cell having a third cell height less than a second row height of the second circuit row;

wherein the first circuit cell in the first circuit row is at least partially aligned with the third circuit cell in the second circuit row.

2. The semiconductor structure of claim 1, wherein horizontal centers of the first circuit cell and the second circuit cell are aligned with a horizontal center line of the first circuit row.

3. The semiconductor structure of claim 1, wherein the second cell height comprises a nominal cell height that is the same as the first row height of the first circuit row.

4. The semiconductor structure of claim 1, wherein the second cell height comprises a reduced cell height that is less than the first row height of the first circuit row.

5. The semiconductor structure of claim 4, wherein the first circuit row further comprises a fourth circuit cell, the fourth circuit cell having a nominal cell height that is equal to the first row height of the first circuit row.

6. The semiconductor structure of claim 1, wherein the second circuit row further comprises a fourth circuit cell having a fourth cell height greater than the second row height of the second circuit row.

7. The semiconductor structure of claim 1, wherein the first row height of the first circuit row is equal to the second row height of the second circuit row.

8. The semiconductor structure of claim 1, wherein the first circuit cell having the first cell height is adjacent to the second circuit cell having the second cell height within the first circuit row.

9. The semiconductor structure of claim 1, wherein at least one of the first circuit cell and the second circuit cell has one or more inset power rails.

10. The semiconductor structure of claim 1, wherein at least one of the first circuit cell and the second circuit cell has one or more backside power rails.

11. A semiconductor structure comprising:

a first circuit row, the first circuit row comprising a first circuit cell having a first cell height greater than a first row height of the first circuit row; and a second circuit row adjacent the first circuit row, the second circuit row comprising a second circuit cell having a second cell height greater than a second row height of the second circuit row;

wherein a first portion of the first circuit cell extends into the second circuit row, a second portion of the second circuit cell extends into the first circuit row, and the first portion of the first circuit cell is offset from the second portion of the second circuit cell; and wherein a horizontal center of the first circuit cell is aligned with a first horizontal center line of the first circuit row and a horizontal center of the second circuit cell is aligned with a second horizontal center line of the second circuit row.

12. The semiconductor structure of claim 11, wherein the first circuit row further comprises a third circuit cell having a third cell height less than the first row height of the first circuit row.

13. The semiconductor structure of claim 11, wherein the first circuit row further comprises a third circuit cell having a third cell height equal to the first row height of the first circuit row.

14. The semiconductor structure of claim 11, wherein the first row height of the first circuit row is equal to the second row height of the second circuit row.

15. A semiconductor structure comprising:

a first circuit row, the first circuit row having a first set of two or more circuit cells having different cell heights, wherein horizontal centers of the first set of two or more circuit cells are aligned with a first horizontal center line of the first circuit row; and a second circuit row adjacent the first circuit row, the second circuit row having a second set of two or more circuit cells having different cell heights, wherein horizontal centers of the second set of two or more circuit cells are aligned with a second horizontal center line of the second circuit row;

wherein the first set of two or more circuit cells comprises a first circuit cell having a first cell height greater than a first row height of the first circuit row and a second circuit cell having a second cell height less than the first row height of the first circuit row.

16. The semiconductor structure of claim 15, wherein the second set of two or more circuit cells comprises a third circuit cell having a third cell height less than a second row height of the second circuit row, and wherein the first circuit cell in the first circuit row is at least partially horizontally aligned with the third circuit cell in the second circuit row.

17. The semiconductor structure of claim 15, wherein the second set of two or more circuit cells comprises a third circuit cell having a third cell height greater than a second row height of the second circuit row, and wherein the first circuit cell in the first circuit row is horizontally offset from the third circuit cell in the second circuit row.

18. The semiconductor structure of claim 15, wherein the first set of two or more circuit cells further comprises a third circuit cell having a third cell height equal to the first row height of the first circuit row.

19. The semiconductor structure of claim 15, wherein the first row height of the first circuit row is equal to a second row height of the second circuit row.

20. The semiconductor structure of claim 15, wherein the first circuit cell having the first cell height is adjacent to the second circuit cell having the second cell height within the first circuit row.

* * * * *